(12) United States Patent
Krauser et al.

(10) Patent No.: US 8,535,970 B2
(45) Date of Patent: Sep. 17, 2013

(54) MANUFACTURING PROCESS FOR MAKING PHOTOVOLTAIC SOLAR CELLS

(75) Inventors: Ranier Krauser, Kostheim (GE); Lawrence A. Clevenger, Austin, TX (US); Kevin Prettyman, Austin, TX (US); Brian Christopher Sapp, Austin, TX (US); Kevin S. Petrarca, Austin, TX (US); Harold John Hovel, Austin, TX (US); Gerd Pfeiffer, Austin, TX (US); Zhengwen Li, Austin, TX (US); Carl John Radens, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 13/154,140

(22) Filed: Jun. 6, 2011

(65) Prior Publication Data

US 2011/0318865 A1  Dec. 29, 2011

(51) Int. Cl.
*H01L 21/00* (2006.01)

(52) U.S. Cl.
USPC .... 438/97; 438/98; 257/E21.114; 257/E31.12

(58) Field of Classification Search
USPC ............ 136/261, 249; 257/E31.12, E21.114; 438/97, 98
See application file for complete search history.

(56) References Cited

U.S. PATENT DOCUMENTS

| | | | |
|---|---|---|---|
| 5,538,564 A * | 7/1996 | Kaschmitter | 136/255 |
| 7,897,867 B1 * | 3/2011 | Mulligan et al. | 136/256 |
| 7,998,863 B2 * | 8/2011 | Wenham et al. | 438/675 |
| 2009/0110808 A1 | 4/2009 | Rana et al. | |
| 2010/0059117 A1 * | 3/2010 | Shi et al. | 136/258 |
| 2010/0068886 A1 | 3/2010 | Yu et al. | |

* cited by examiner

*Primary Examiner* — Caridad Everhart
(74) *Attorney, Agent, or Firm* — J. B. Kraft; Steven G. Bennett

(57) ABSTRACT

The invention relates to a manufacturing process of a photovoltaic solar cell (100) comprising:
  providing high doped areas (20) on the rear side (18) of the photovoltaic solar cell (100),
  providing localized metal contacts (30) localized on said high doped areas (20),
  providing a passivation layer (50) covering a surface (52) between said contacts (30), wherein the contacts (30) remain substantially free of the passivation layer (50), and
  depositing a metal layer (32) for a back surface field.

15 Claims, 6 Drawing Sheets

MANUFACTURING PROCESS FOR MAKING PHOTOVOLTAIC SOLAR CELLS

RELATED APPLICATION

This application is based on and claims the benefit of Priority from German Patent Application 10167298, filed Jun. 25, 2010.

FIELD OF THE INVENTION

The invention relates to a manufacturing process for making photovoltaic cells, more particularly for making back contacts of photovoltaic solar cells.

BACKGROUND OF THE INVENTION

Solar cell products usually comprise a semiconductor substrate, preferably a silicon substrate with a photoactive p-n-junction, on a front surface being covered with a contact grid comprising stripes and finger-like structures, and a rear side with an electrical contact covering the entire rear side of the solar cell. The rear side is often prepared with screen printing methods.

In US 2009/0110808 A1 a manufacturing process is disclosed for preparing back contacts and surface fields on the rear side of a photovoltaic solar cell. Molten aluminum is used to form the contact regions by utilizing a spraying method, which may produce distributed point contacts and localized back surface fields for a passivated rear surface of the solar cell. The molten aluminium is sprayed on a dielectric layer arranged on the rear surface. The aluminium droplets can locally penetrate the dielectric layer and react with the silicon underneath.

The rear side metallization has a non-negligible influence on the efficiency of the solar cell. When forming the aluminum back contact, a degradation of the dielectric layer may decrease the efficiency of the solar cell by typically 1%-1.5%. Increasing the efficiency of solar cells has a great influence on the overall efficiency of a solar cell array comprising a great number of solar cells.

SUMMARY OF THE INVENTION

It is an object of the invention to provide a manufacturing process for a photovoltaic solar cell with improved efficiency by reducing degradation of a dielectric layer on a rear side of the solar cell.

This object is achieved by the features of claim 1. The other claims and the specification disclose advantageous embodiments of the invention.

A manufacturing process of a photovoltaic solar cell is proposed, comprising the steps of providing high doped areas on the rear side of the photovoltaic solar cell; providing localized metal contacts localized on said high doped areas; providing a passivation layer covering a surface between said contacts wherein the contacts remain substantially free of the passivation layer; and finally depositing a metal layer for a backside field.

Preferably, a deterioration of the dielectric layer while establishing an electrical contact between the solar cell body, e.g. p-doped Si, and the metallic contacts can be avoided. The metallic contact does not need to penetrate the dielectric layer; thus, harsh conditions usually necessary for penetration of aluminum through the dielectric layer are not necessary. A firing step can be performed together with a front side contact annealing step, thus reducing the thermal load of the solar cell during manufacture.

It is possible to integrate the back contact manufacturing process steps into a given process flow of the manufacture of a solar cell and can easily comply with requirements of a volume production of solar cells.

Advantageously, said high doped areas may be manufactured by masking or laser doping. When utilizing a masking technique, the same mask can be used for depositing the metal contacts on the high doped areas.

Said localized metal contacts may be manufactured by screen printing, mask plating, laser plating or any combination thereof. The metal contact expediently comprises a material that forms good electrical contact with the material of the solar cell, usually Si.

An annealing step may be applied to improve or to establish a local electrical contact between the metal contact and the underlying high doped area. This annealing step can be performed at the same time as an annealing step of metallic contacts on the front side of the solar cell.

Advantageously, the passivation layer on sidewalls of the metal contacts may be removed by annealing, wet etching, reactive ion etching, ion milling or any combination thereof. The technique can be selected dependent on the actual material used for the passivation layer and/or the metal contact. Particularly, use can be made of selective etching properties of the materials.

In an expedient development, the passivation layer may be deposited anisotropically so that a passivation layer thickness deposited on sidewalls of the metal contacts is thinner than a passivation layer thickness on a front surface of the metal contacts. The passivation layer can be deposited on the complete rear surface without masking. Even if the passivation layer covers the rear side, portions of the passivation layer on the metal contacts can be bypassed by embedding such portions in the metal contacts and/or in the metallic layer forming the backside field. Advantageously, the layer thickness of the passivation layer can be established in a way to comply with requirements of antireflection conditions. Particularly, the layer thickness can be large enough so as to achieve sufficient antireflection properties of the passivation layer. On the other hand, the passivation layer deposited on the sidewalls can be removed easier than on the front surface of the metal contacts.

The high doped areas may be doped with boron. Boron is a convenient material to establish p++ doping in semiconducting materials such as Si.

The metal contacts may comprise at least one of aluminum, nickel, titanium, cobalt, platinum or tungsten. Other metals may also be used. The preferred metals are those that form good ohmic contacts with the semiconductor material of the solar cell, such as Si.

Expediently, the metal contacts may comprise a dopant, preferably boron. Boron is a convenient material to establish p++ doping in semiconducting materials such as Si.

The passivation layer may comprise at least one of SiOx, SiNx, SiOxNy or Al2O3. Such materials are well known in the manufacturing of solar cells.

A layer thickness of the passivation layer between the metal contacts may be established according to antireflection requirements.

Preparation of high doped areas on the rear side may be performed in a process step in close vicinity to doping process steps of a front side of the photovoltaic solar cell. The inventive process can be integrated in standard manufacturing processes of photovoltaic solar cells.

BRIEF DESCRIPTION OF THE DRAWINGS

The present invention, together with the above-mentioned and other objects and advantages, may best be understood from the following detailed description of the embodiments, but not restricted to the embodiments, wherein is shown.

Figure 1:
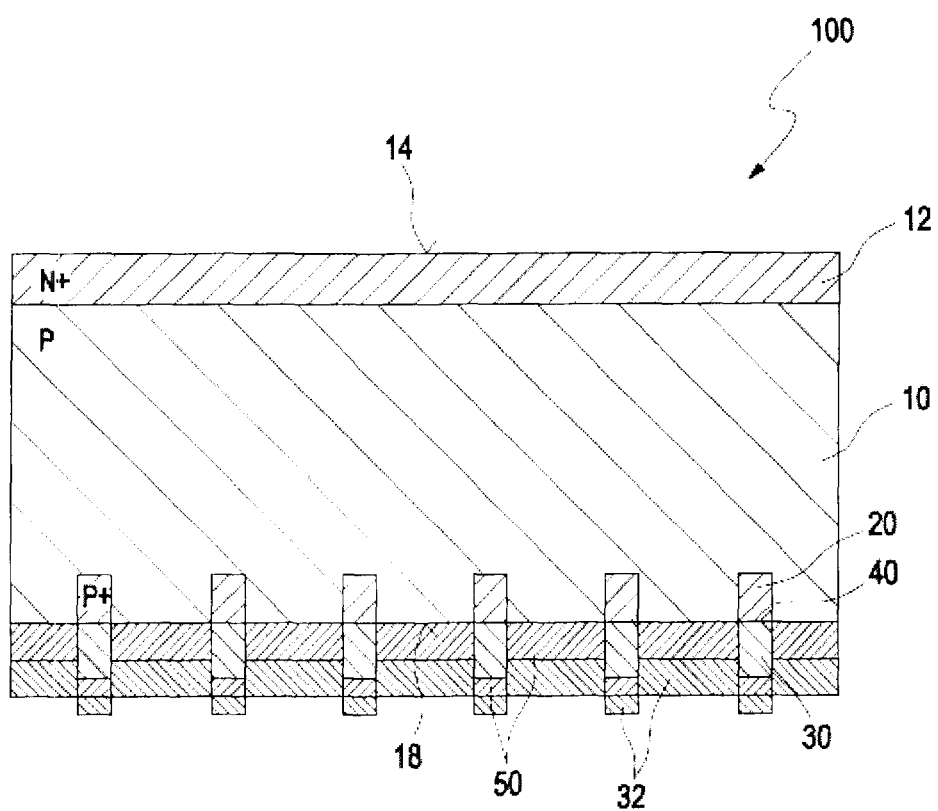
FIG. 1 a cross section of a solar cell manufactured with the inventive manufacturing process.

In the drawings, like elements are referred to with equal reference numerals. The drawings are merely schematic representations, not intended to portray specific parameters of the invention. Moreover, the drawings are intended to depict only typical embodiments of the invention and therefore should not be considered as limiting the scope of the invention.

DETAILED DESCRIPTION OF EXAMPLE EMBODIMENTS

FIG. 1 depicts a cross section of a solar cell 100 manufactured with the inventive manufacturing process. The solar cell 100 comprises a semiconductor body 10, where the bulk material is typically lightly p-doped and a high doped n+-layer 12 on its front surface 14 forming a p/n junction close to the front surface 14.

On the rear side 18 of the semiconductor body 10, localized high doped (p++) areas 20, i.e. boron doped, are arranged in the semiconductor body 10. On top of the high doped areas 20 metal contacts 30 are formed having an interface 40. A passivation layer 50 is arranged between the localized metal contacts 30. On top of the passivation layer 50 a metal layer 32 is arranged, covering the passivation layer 50, as well as the metal contacts 30. As a result, portions of the passivation layer 50 that are arranged on the metal contacts 30 are embedded in the metal layer 32.

Figure 2:
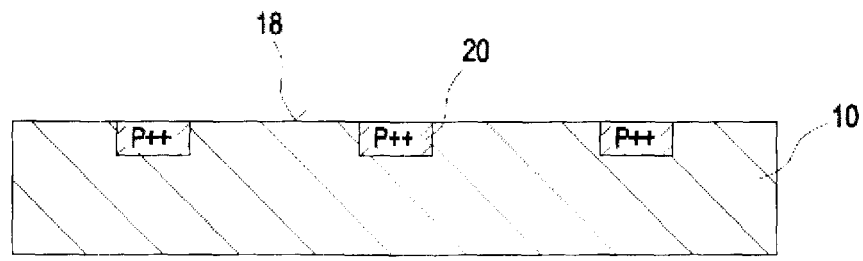
FIGS. 2a-2c first process steps for forming metal contacts and a passivation layer as a starting point for several variants of an inventive process.
Figure 2:
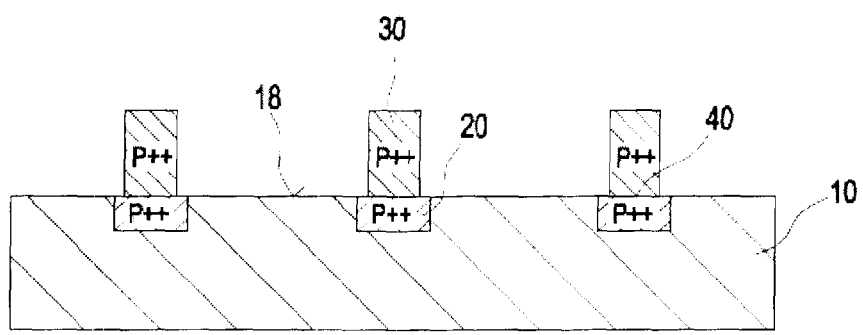
Figure 2:
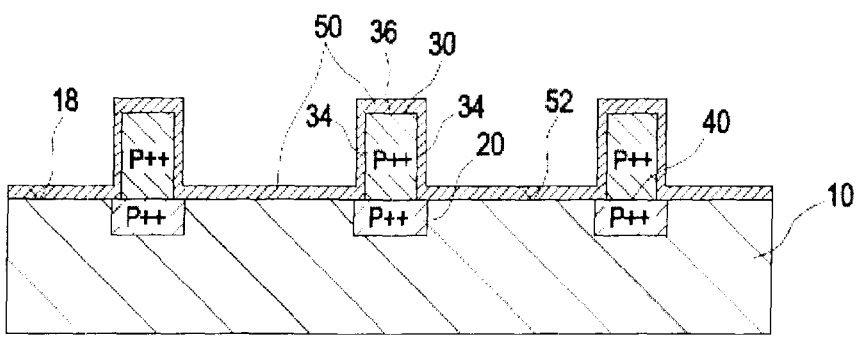

FIGS. 2a through 2c illustrate first process steps for forming metal contacts 30 on high doped areas 20 on a rear surface of a p-doped semiconductor body 10, e.g. made of Si. The dopant may be boron. The high p++-doped areas 20 may be prepared following process steps finishing the front side of the semiconductor body 10 (not shown).

The localized high doped areas 20 shown in FIG. 2a may be prepared, e.g. by print techniques or wet doping, followed by an annealing step, preferably by a laser treatment such as laser ablation.

FIG. 2b depicts metal contacts 30, each metal contact 30 selectively deposited on a high doped area 20 on the rear side 18 of the semiconductor body 10, i.e. by using laser assisted chemical vapor deposition. The metal contact 30 also comprises a high p++ doped material, i.e. boron-doped aluminum, titanium, cobalt, nickel, platinum, tungsten or the like, which are known to establish high quality contacts to the semiconductor body 10. The metal contacts 30 are protruding from the rear surface 18 of the semiconductor body 10.

A passivation layer 50 is deposited on the rear side 18 of the semiconductor body 10, covering both metal contacts 30 and the surface 52 between the metal contacts 30, as shown in FIG. 2c. Preferably, the deposition is anisotropic so that the passivation layer 50 is thicker on the front surfaces 36 of the metal contacts 30 than on sidewalls 34 of the metal contacts. For instance, the passivation layer 50 can be deposited with physical vapor deposition such as evaporation or sputtering. Generally, evaporation results in a more anisotropic deposition than sputtering. The passivation layer 50 may comprise oxides, nitrides, oxynitrides and the like, such as SiOx, SiNx, SiOxNy or Al2O3.

The thickness of the passivation layer 50 can be adapted to comply with antireflection requirements of the solar cell. Having a thinner passivation layer 50 on the sidewalls 34 of the metal contacts 30 facilitates the removal of such portions of the passivation layer 50 from the sidewalls 34.

Figure 3:
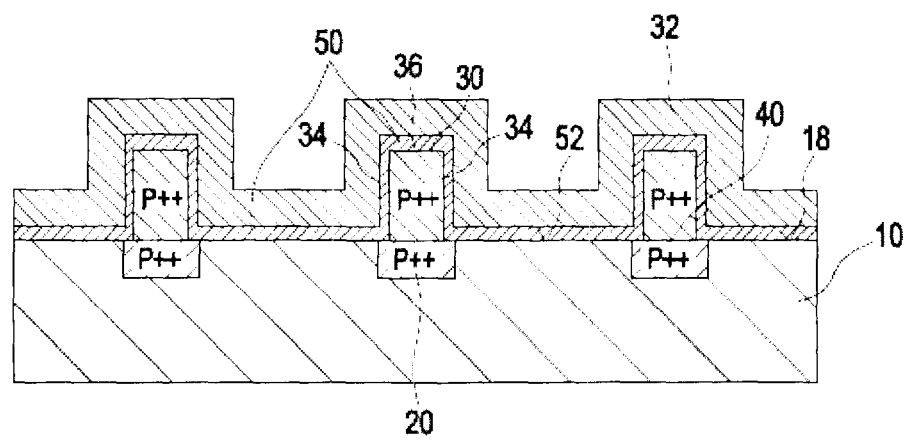
FIGS. 3a-3b process steps of a first variant of the invention starting from the process step of FIG. 2c.
Figure 3:
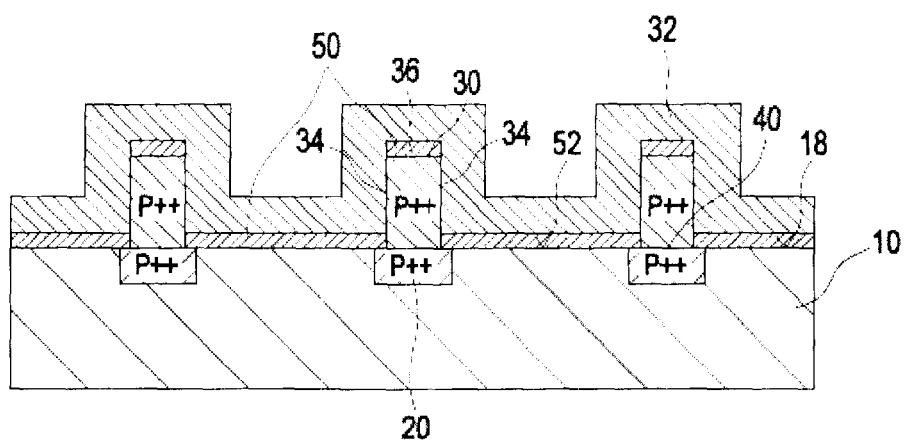

Starting from the rear side 18 of the semiconductor body 10 covered with the passivation layer 50 as shown in FIG. 2c, FIGS. 3a through 3b illustrate process steps of a first variant of the invention.

In the step illustrated in FIG. 3a, a metal layer 32, i.e. an aluminum layer, is deposited on the passivation layer 50. The metal layer 32 may by much thicker than the passivation layer 50. Preferably, the metal layer 32 is deposited utilizing screen printing.

In FIG. 3b an annealing or firing step has been performed. As a result the metal layer 32 has penetrated the thin portions of the passivation layer 50 on the sidewalls 34 of the metal contacts 30 thus establishing a metallic interface between the metal layer 32 and the metal contacts 30. Further, the metal contacts 30 have an improved contact to the high doped areas 20 because the annealing step allows for penetration of thin oxides on top of the high doped areas 20.

Starting from the rear side 18 of the semiconductor body 10 covered with the passivation layer as shown in FIG. 2c, FIGS. 4a through 4c illustrate process steps of a second variant of the invention.

Figure 4:
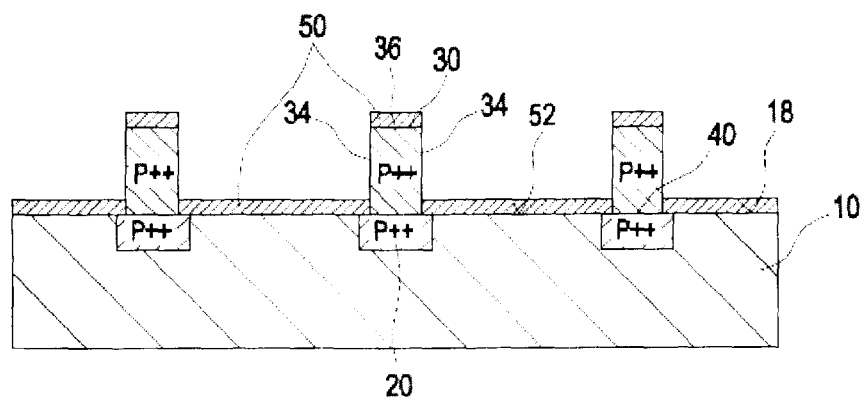
FIGS. 4a-4c process steps of a second variant of the invention starting from the process step of FIG. 2c.
Figure 4:
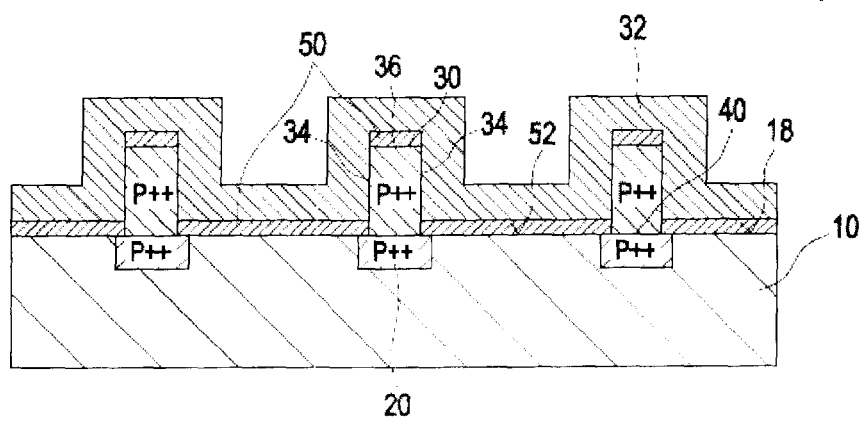
Figure 4:
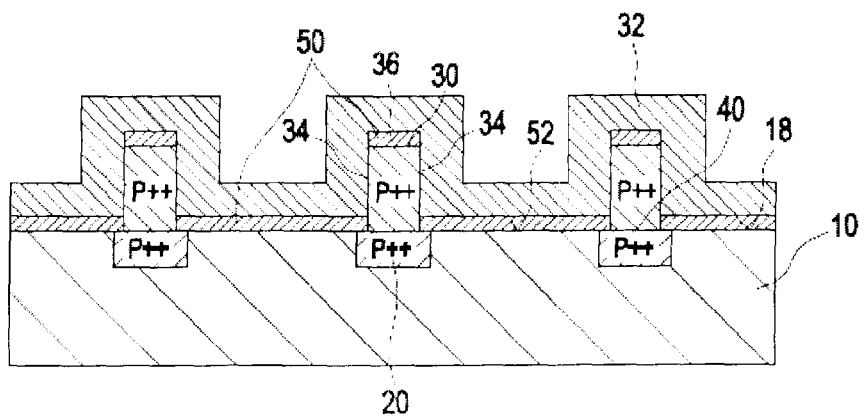

In the step illustrated in FIG. 4a an isotropic wet etching step is performed on the passivation layer 50 thus removing the thin portions of the passivation layer 50 deposited on the sidewalls 34 of the contact metals 30. The thickness of the other portions of the passivation layer 50 is slightly reduced. This reduction can be taken into account when the passivation layer 50 is deposited so that the remaining thickness still complies with antireflection requirements.

In the step illustrated in FIG. 4b, a metal layer 32, i.e. an aluminum layer, is deposited on the passivation layer 50. The metal layer 32 may be much thicker than the passivation layer 50. Preferably, the metal layer 32 is deposited utilizing screen printing.

In FIG. 4c an annealing or firing step has been performed. As a result the metal layer 32 has penetrated residual thin portions of the passivation layer 50 or thin oxides on the sidewalls 34 of the metal contacts 30 thus establishing a metallic interface between the metal layer 32 and the metal contacts 30. Further, the metal contacts 30 have an improved contact to the high doped areas 20 because the annealing step allows for penetration of thin oxides on top of the high doped areas 20.

Starting from the rear side 18 of the semiconductor body 10 covered with the passivation layer 50, as shown in FIG. 2c, FIGS. 5a through 5c illustrate process steps of a third variant of the invention. These steps may follow the usual process steps to finish the front side of the solar cell (not shown).

The passivation layer 50 is in this variant is, preferably, a dielectric material such as SiOx, SiNx, SiOxNy, Al2O3 or the like.

Figure 5:
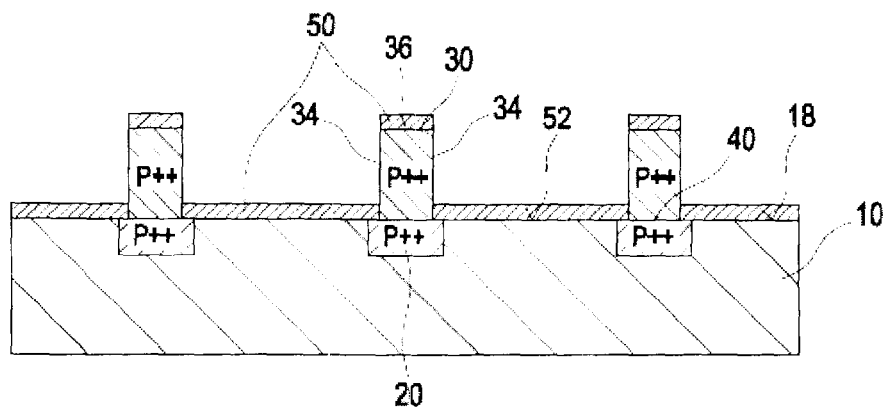
FIGS. 5a-5c process steps of a third variant of the invention starting from the process step of FIG. 2c.
Figure 5:
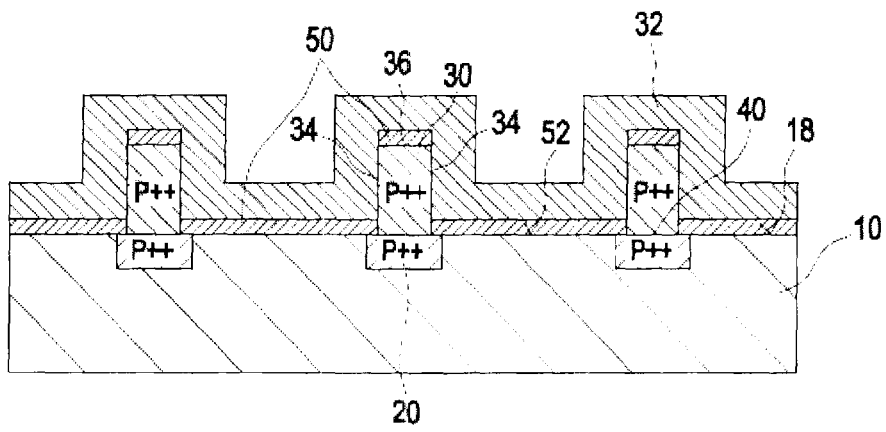
Figure 5:
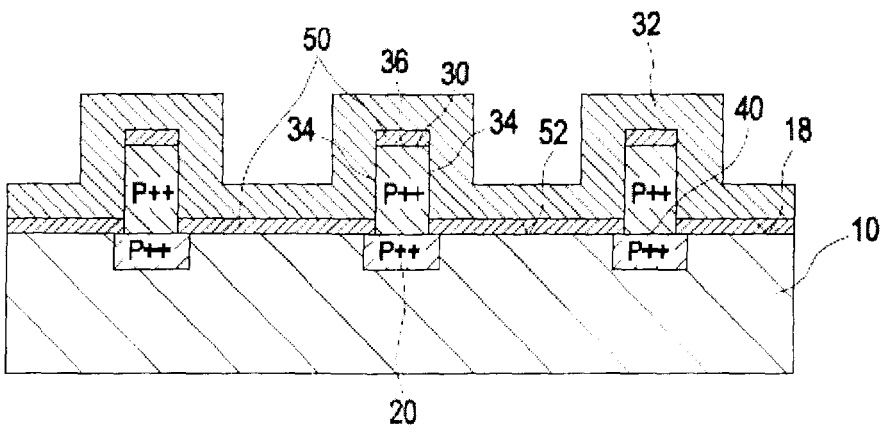

In the step illustrated in FIG. 5a an isotropic wet etching step is performed on the passivation layer 50 thus removing the thin portions of the passivation layer 50 deposited on the sidewalls 34 of the contact metals 30. The thickness of the other portions of the passivation layer 50 is slightly reduced. This reduction can be taken into account when the passivation layer 50 is deposited so that the remaining thickness still complies with antireflection requirements.

In the step illustrated in FIG. 5b, a metal layer 32, i.e. an aluminum layer, nickel layer or the like, is deposited on the passivation layer 50. The metal layer 32 may be much thicker than the passivation layer 50. Preferably, the metal layer 32 is deposited utilizing a plating technique such as electroless plating.

In FIG. 5c an annealing or firing step has been performed. As a result the metal layer 32 has penetrated residual thin portions of the passivation layer 50 or thin oxides on the sidewalls 34 of the metal contacts 30 thus establishing a metallic interface between the metal layer 32 and the metal contacts 30. Further, the metal contacts 30 have an improved contact to the high doped areas 20 because the annealing step allows for penetration of thin oxides on top of the high doped areas 20.

Starting from the rear side 18 of the semiconductor body 10 covered with the passivation layer 50, as shown in FIG. 2c, FIGS. 6a through 6c depict process steps of a fourth variant of the invention.

In this variant, however, the passivation layer 50 may be deposited conformal to the metal contacts 30, i.e. have similar thicknesses on the front surfaces 36 and on the sidewalls 34 of the metal contacts 30.

Figure 6:
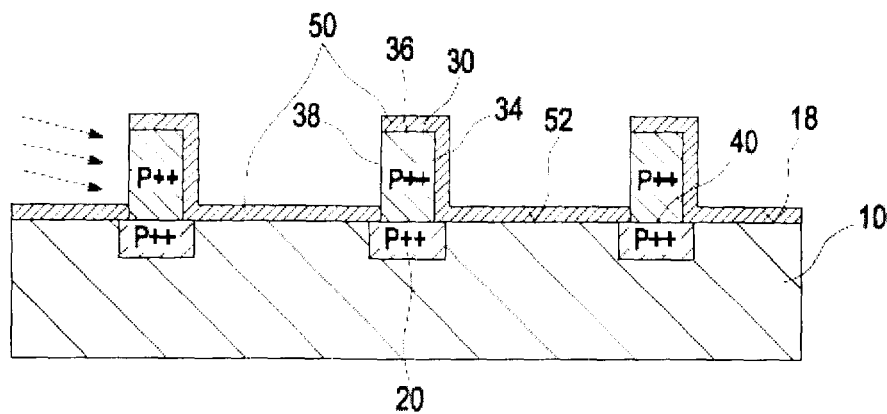
FIGS. 6a-6c process steps of a fourth variant of the invention starting from the process step of FIG. 2c.
Figure 6:
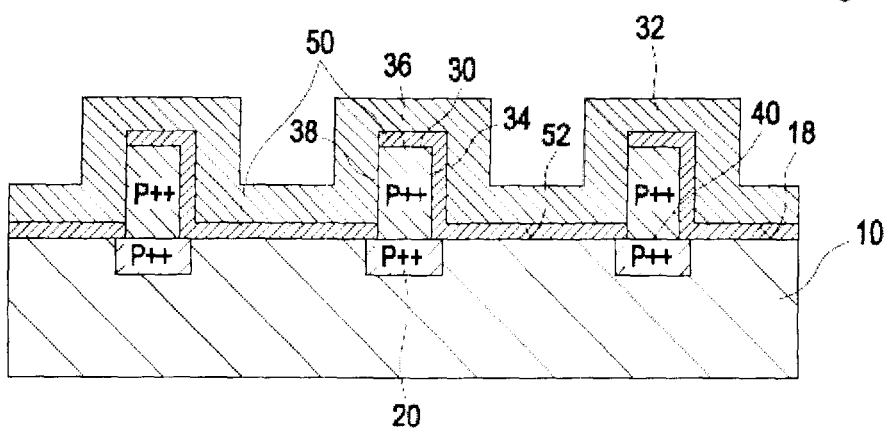
Figure 6:
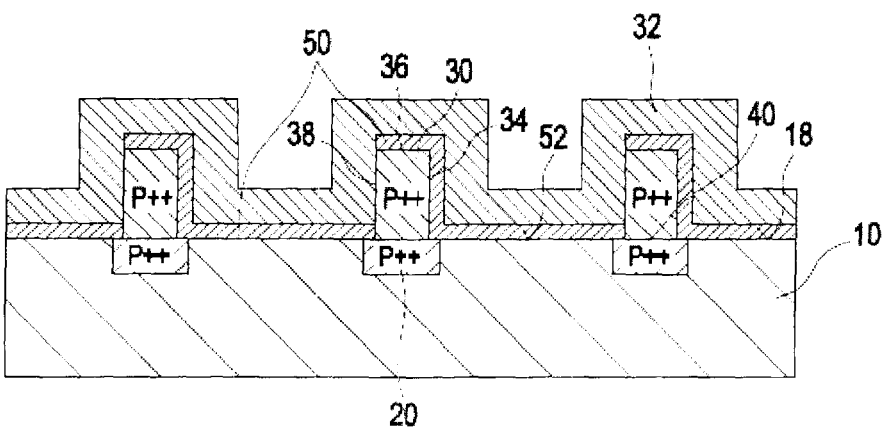

In FIG. 6a an anisotropic etching step is illustrated thereby removing only portions of the passivation layer 50 on sidewalls 38 of the metal contacts 30. The anisotropic etching step may be performed with reactive ion etching where an ion beam impinges on the sidewalls 38 thus removing the passivation layer 50 in these areas.

In the step illustrated in FIG. 6b, a metal layer 32, i.e. an aluminum layer, nickel layer or the like, is deposited on the passivation layer 50. The metal layer 32 may be much thicker than the passivation layer 50. Preferably, the metal layer 32 is deposited utilizing a plating technique such as screen printing.

In FIG. 6c an annealing or firing step has been performed. As a result the metal layer 32 has penetrated residual thin portions of the passivation layer 50 or thin oxides on the sidewalls 38 of the metal contacts 30 thus establishing a metallic interface between the metal layer 32 and the metal contacts 30. Further, the metal contacts 30 have an improved contact to the high doped areas 20 because the annealing step allows for penetration of thin oxides on top of the high doped areas 20.

Generally, for depositing the metal layer 32, instead of screen printing, plating techniques such as electroless plating can be used and vice versa.

It is also possible to combine the process steps of the various embodiments shown in the Figs.

It is preferred that the metal contacts 30 align with the high doped areas 20 as well as possible. In case the high doped areas 20 are manufactured by laser ablation (which is done using computer control) the computerized coordinates can be used to position the metal contacts 30 with high accuracy. In case a mask is used to position high doped areas 20 the same mask should be used for the metal contacts 30.

It is advantageous that the high doped areas 20 reach deep into the semiconductor body 10. Typical depths are 1 μm up to 1.5 μm. The localized high doped areas 20 can be realized in various ways, i.e. by using printing techniques, as well as hard mask and, of course, local laser doping. The same hard mask can be used later on to position the metal contacts 30. The laser pattern can be used, as well, to position the metal contacts 30. The metal contacts 30 must be placed accurately on top of the high doped areas 20. An alternative to using a laser might also be the use of a focused lamp, where stencil masks can be used to realize the openings. This is based on the fact that one has to realize scaling precision in the order of 100 μm.

Additional doping on the rear side for the high doped areas 20, as well as the metal contacts 30, can be introduced at an actual doping step in the process. Front doping is a regular n+ doping (phosphor) where the high doped areas 20 on the rear side 18 are realized using boron. The deposition can be made, e.g. through hard mask and laser ablation. The passivation layer 50 on the rear side 18 can be done at the same process step together with the front side passivation.

Generally, other methods can be used to make the metal contacts 30, such as utilizing micro tubes, or screen printed etching paste (used today.

By improving the electric contacts on the rear side 18, efficiency improvements of 1-2% can be achieved.

What is claimed is:

1. A process for the manufacture of a photovoltaic solar cell comprising:
    forming a plurality of separated highly doped areas on the rear side of a photovoltaic solar cell;
    forming a corresponding plurality of separated metallic contacts coincident with said highly doped areas;
    forming a passivation layer on a surface between said plurality of contacts wherein the contacts remain free of said passivation layer;
    removing the passivation layer from sidewalls of said metallic contacts; and
    depositing a metal layer over said passivation layer, wherein a backsurface field is provided for said metallic layer.

2. The process of claim 1 wherein said highly doped areas are formed through masking.

3. The process of claim 1 wherein said highly doped areas are formed through laser doping.

4. The process of claim 1 wherein said metal contacts are formed by screen printing.

5. The process of claim 1 wherein said metal contacts are formed by mask plating.

6. The process of claim 1 wherein said metal contacts are formed by laser plating.

7. The process of claim 1 further including annealing the contact between the plurality of highly doped areas and their coincident metallic contacts.

8. The process of claim 1 wherein said passivation layer is deposited anistropically so that the thickness of the passivation layer on sidewalls of said metallic contacts is less than the thickness of the passivation layer on said surface.

9. The process of claim 1 wherein said highly doped areas are doped with boron.

10. The process of claim 1 wherein said passivation layer comprises a passivation composition selected from the group consisting of silicon oxide, silicon nitride, silicon oxynitride, and aluminum oxide.

11. The process of claim 1 wherein the thickness of the passivation layer is based upon antireflection requirements.

12. The process of claim 1 further including forming a doped layer on the front surface of the photovoltaic solar cell during the forming of said highly doped areas on said rear side.

13. The process of claim 1 wherein the metallic contacts comprise a metal selected from the group consisting of aluminum, nickel, titanium, cobalt, platinum, and tungsten.

14. The process of claim 13 wherein said metallic contacts further include a dopant.

15. The process of claim 14 wherein the dopant in said metallic contacts is boron.

* * * * *